US006989590B2

(12) United States Patent
Hanada et al.

(10) Patent No.: US 6,989,590 B2
(45) Date of Patent: Jan. 24, 2006

(54) POWER SEMICONDUCTOR DEVICE WITH A CONTROL CIRCUIT BOARD THAT INCLUDES FILLED THROUGH HOLES

(75) Inventors: Hironobu Hanada, Hiroshima (JP); Yasuo Koutake, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 3 days.

(21) Appl. No.: 10/793,800

(22) Filed: Mar. 8, 2004

(65) Prior Publication Data
US 2005/0012198 A1    Jan. 20, 2005

(30) Foreign Application Priority Data
Jul. 17, 2003    (JP) ............................. 2003-276050

(51) Int. Cl.
*H01L 23/48* (2006.01)
(52) U.S. Cl. ...................... 257/691; 361/783; 174/264
(58) Field of Classification Search ................ 257/691, 257/701; 361/735, 736, 760, 783; 174/264, 174/265
See application file for complete search history.

(56) References Cited

U.S. PATENT DOCUMENTS 5,444,297 A * 8/1995 Oshima et al. ............. 257/691
6,421,244 B1 * 7/2002 Shinohara et al. .......... 361/736
6,633,005 B2 * 10/2003 Ichitsubo et al. ........... 174/260
6,774,465 B2 * 8/2004 Lee et al. ................... 257/671
2001/0008483 A1 * 7/2001 Lee et al. ................... 361/790

FOREIGN PATENT DOCUMENTS

JP        8-32240        2/1996

* cited by examiner

Primary Examiner—Stephen W. Smoot
(74) Attorney, Agent, or Firm—Oblon, Spivak, McClelland, Maier & Neustadt, P.C.

(57) ABSTRACT

A power semiconductor device according to the present invention comprises at least one insulating substrate; at least one power semiconductor element mounted on a metal pattern formed on the main surface of the insulating substrate; and a control circuit board which is arranged so that its first surface can oppose the above main surface of the insulating substrate with the power semiconductor element interposed therebetween, and which has at least one electronic component for control, mounted on a metal pattern formed on its second surface in parallel to the above first surface, and at least one through hole formed vertically to the first and second surfaces so as to electrically connect circuit patterns laminated between the first surface and the second surface, and this power semiconductor device is characterized in that the above through hole is filled with a filler.

3 Claims, 4 Drawing Sheets

POWER SEMICONDUCTOR DEVICE WITH A CONTROL CIRCUIT BOARD THAT INCLUDES FILLED THROUGH HOLES

CROSS-REFERENCE TO RELATED APPLICATION

The present application claims the benefit of patent application No. 2003-276050 filed in Japan on Jul. 17, 2003, the subject matter of which is hereby incorporated herein by reference.

BACKGROUND OF THE INVENTION

1. Field of the Invention

The present invention relates to a semiconductor device, and in particular, to a power semiconductor device comprising a control circuit board.

2. Description of the Related Art

Control circuit boards having electronic components mounted thereon for controlling switching elements are used in semiconductor devices such as intelligent power modules or IPM. Through holes are formed in such a control circuit board having a multi-layer structure, so as to connect the electric patterns of the respective layers. These through holes are, literally, hollow inside. In case where a control circuit board of this type is set in the vicinity of switching elements, noises from the switching elements which are being switched transmit via these through holes and may give an adverse influence on the electronic components mounted on the control circuit board and patterns formed thereon.

Test pads are provided on the control circuit board so as to test the continuity of the control circuit board or to check up an error in the mounting of electronic components after the electronic components have been mounted thereon. As such test pads, for example, circular pads with diameters of 0.5 mm are used. These test pads, however, considerably occupy the space of the control circuit board having a restricted surface area. As a result, it is not avoidable to reduce the ground solids of a pattern on the control circuit board. The reduction of the ground solid pattern also possibly gives an adverse influence on the noise resistance of the electronic components and the pattern on the circuit board.

In this connection, JP-A-08-32240 discloses a technique of filling up the through holes of a multi-layer wiring board, and JP-A-06-69680 discloses a technique of forming through holes having other functions.

SUMMARY OF THE INVENTION

Objects of the present invention are, therefore, to improve the resistance of a power semiconductor device to noises, to realize a compact power semiconductor device by fabricating a compact control circuit board, and to allow an electrically conductive solid pattern to achieve a ground potential with a simple structure.

The present invention is developed in order to achieve the foregoing objects. A power semiconductor device according to the present invention comprises at least one insulating substrate; at least one power semiconductor element mounted on a metal pattern formed on the main surface of the insulating substrate; and a control circuit board which is arranged so that its first surface can oppose the above main surface of the insulating substrate with the power semiconductor element interposed therebetween, and which has at least one electronic component for control, mounted on a metal pattern formed on its second surface in parallel to the above first surface, and at least one through hole formed vertically to the first and second surfaces so as to electrically connect circuit patterns laminated between the first surface and the second surface, and this power semiconductor device is characterized in that the above through hole is filled with a filler.

The following effects can be produced by applying the present invention.

It is possible to prevent the transmission of noises to the main surface (the upper surface) of a control circuit board via the through holes of the control circuit board. Accordingly, it becomes possible to provide a power semiconductor device having an improved resistance to noises by mounting electronic components, etc. on the main surface of such a control circuit board.

DETAILED DESCRIPTION OF THE PREFERRED EMBODIMENTS

Hereinafter, preferred embodiments according to the present invention will be described with reference to the accompanying drawings.

Embodiment 1

Figure 1:
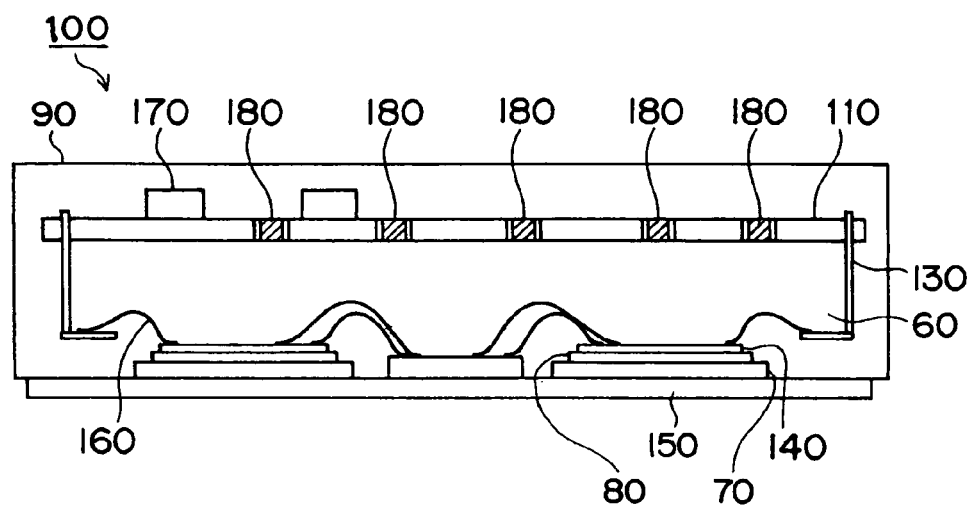
FIG. 1 is a schematic longitudinal sectional view of a power semiconductor device according to the first embodiment of the present invention.

FIG. 1 is a schematic longitudinal sectional view of a power semiconductor device (100) according to the first embodiment of the present invention. In this regard, an example of the power semiconductor device of the present invention is an insulated gate bipolar transistor or IGBT. The power semiconductor device (100) comprises a resinous package (90) made of an insulating material such as a resin or the like, and a base plate (150) made of a metal having a high thermal conductivity, such as copper or the like. The package (90) is fixed at its base to the base plate (150) with metal screws or adhesive (not drawn). The power semiconductor device (100) includes, within the package (90), insulating substrates (70) each of which has a pattern (80) of a metal such as copper formed thereon, and switching elements (140) each of which is mounted on the metal pattern (80) through solder (not drawn). In another case, metal patterns (not shown in the drawing) may be formed on the undersides of the insulating substrates (70) and bonded to the base plate (150) with solder.

As seen in FIG. 1 the power semiconductor device (100) further include relay terminals (130) and a control circuit board (110). The control circuit board (110) has various electronic components (170) mounted on metal patterns (not drawn) so as to control the switching elements (140). Each of the relay terminals (130) is allowed to extend downward from the control circuit board (110) and bent along the base of the package. The relay terminal (130) is connected to the switching element with an aluminum wire (160).

The upper portion from above the switching elements (140) and the insulating substrates (70) is filled with silicone gel (60) (not indicated by cross-hatching for clear understanding of the drawing) so as to protect the switching elements (140).

Figure 7:
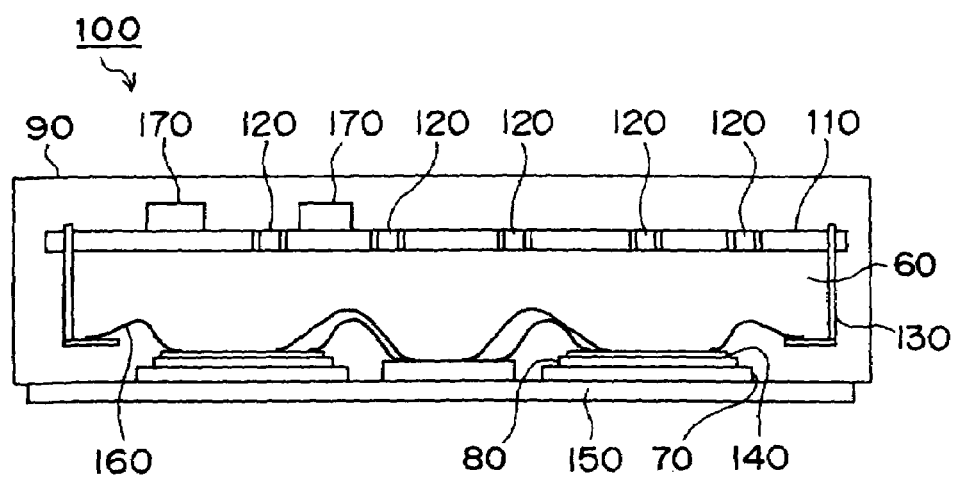
FIG. 7 is a schematic longitudinal sectional view of a conventional power semiconductor device.

The control circuit board (110) comprises a plurality of layers having electrical patterns (not drawn) formed thereon, and through holes which are formed to connect the electrical patterns of the respective layers. FIG. 7 shows a schematic longitudinal sectional view of a power semiconductor device according to the prior art, in which the through holes (120) are exactly hollow inside as is obvious at a glance.

On the other hand, in the power semiconductor device (100) according to the first embodiment of the present invention, the through holes are filled with an insulating material (180) which is the same material as that forming the control circuit board (110), as shown in FIG. 1. By doing so, the routes for transmitting noises from the switching elements (140) which are being switched are shut down, and thus, the influence of the noises on the electronic components (170), etc. can be suppressed.

The insulating material (180) which fills the through holes is not limited to the insulating material which forms the control circuit board (110), and it may be other different insulating resin or an insulating rubber.

Embodiment 2

Figure 2:
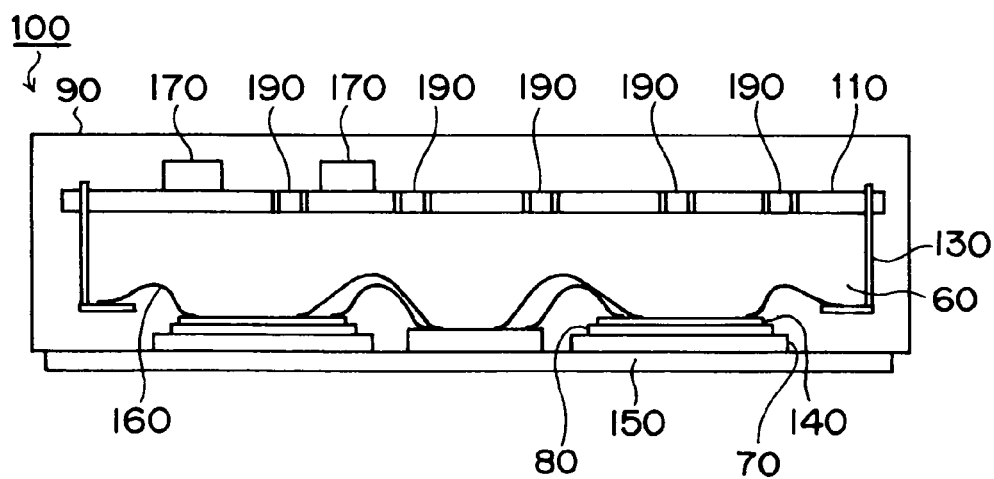
FIG. 2 is a schematic longitudinal sectional view of a power semiconductor device according to the second embodiment of the present invention.

FIG. 2 shows a schematic longitudinal sectional view of a power semiconductor device (100) according to the second embodiment of the present invention. The power semiconductor device (100) according to the second embodiment is substantially the same as that according to the first embodiment. Therefore, the like parts are denoted by the like reference numerals to thereby save the description thereof. Thus, the difference between both embodiments is mainly described.

As shown in FIG. 2, the through holes of the power semiconductor device (100) according to the second embodiment are filled with an electrically conductive material (190).

By doing so, firstly, the routes for transmitting noises from the switching elements (140) which are being switched can be shut off, and thus, the influence of the noises on the electronic components (170), etc. can be suppressed. Further, the volume of the passages of the through holes is added, so that the impedance of the circuit lowers. As a result, it becomes harder to expose the electronic components, etc. to the influence of the noises. Further, this structure serves to stabilize the operation of the circuit.

Embodiment 3

Figure 3:
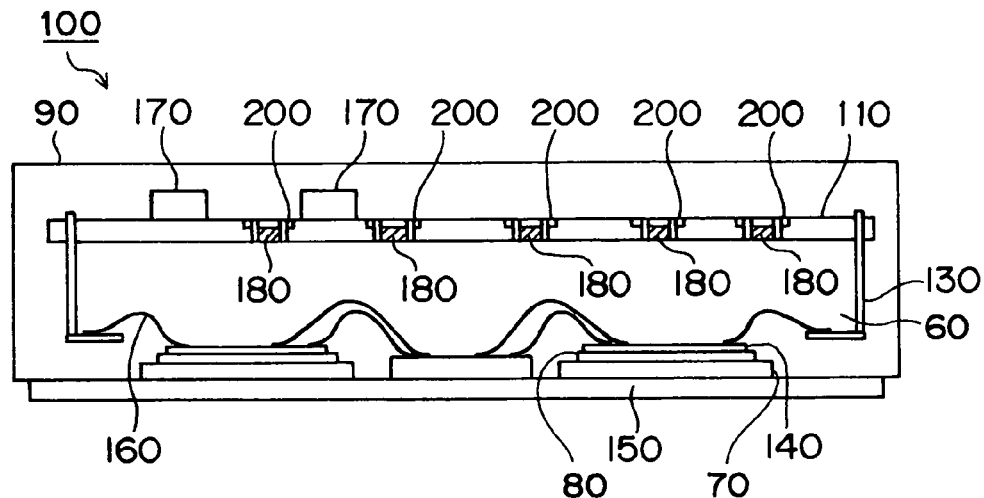
FIG. 3 is a schematic longitudinal sectional view of a power semiconductor device according to the third embodiment of the present invention.

FIG. 3 shows a schematic longitudinal sectional view of a power semiconductor device (100) according to the third embodiment of the present invention. The power semiconductor device (100) according to the third embodiment is substantially the same as that according to the first embodiment. Therefore, the like parts are denoted by the like reference numerals to thereby save the description thereof. Thus, the difference between both embodiments is mainly described.

In the power semiconductor device (100) according to the first embodiment, the through holes of the control circuit board (110) are filled with the insulating material (180). According to the third-embodiment, such through holes are formed together with test pads (200) for use-in testing the continuity of the circuit or checking up an error in the mounting of the electronic components after the components have been mounted.

By doing so, there is no need to separately provide test pads on the control circuit board as in the conventional semiconductor devices. Accordingly, the man-hours to produce with can be decreased, and the cost for the materials can be reduced because-of the decreased space of the resultant power semiconductor device, which results in lower production cost.

Embodiment 4

Figure 4:
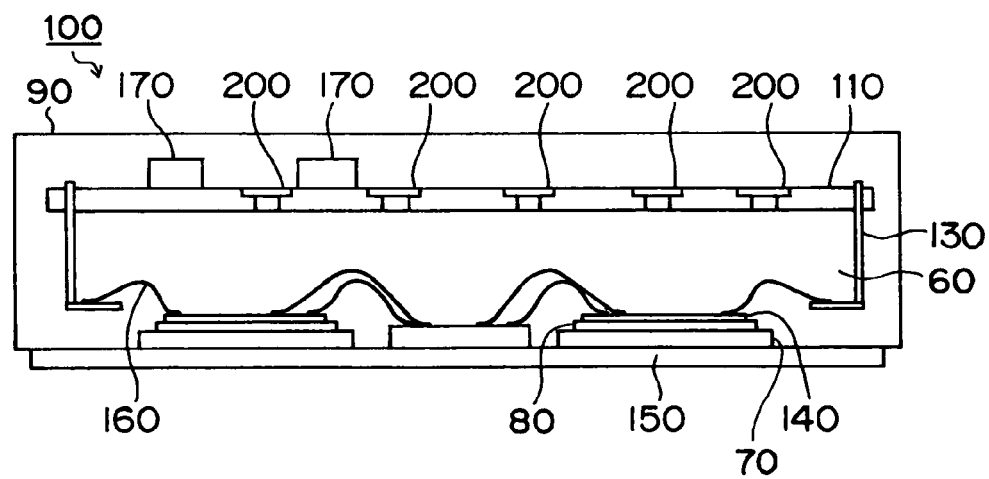
FIG. 4 is a schematic longitudinal sectional view of a power semiconductor device according to the fourth embodiment of the present invention.

FIG. 4 shows a schematic longitudinal sectional view of a power semiconductor device (100) according to the fourth embodiment of the present invention. The power semiconductor device (100) according to the fourth embodiment is substantially the same as that according to the second or third embodiment. Therefore, the like parts are denoted by the like reference numerals to thereby save the description thereof. Thus, the difference between both embodiments is mainly described.

In the power semiconductor device (100) according to the second embodiment, the through holes of the control circuit board (110) are filled with the electrically conductive material (190). According to the fourth embodiment, such through holes are formed together with test pads (200) for use in testing the continuity of the circuit or checking up an error in the mounting of the electronic components after the components have been mounted, as in the third embodiment.

By doing so, there is no need to separately provide test pads on the control circuit board as is done in the conventional semiconductor devices. Accordingly, the man-hours to produce with can be decreased, and the cost for the materials can be reduced because of the decreased space of the resultant power semiconductor device, which results in lower production cost.

Embodiment 5

Figure 5:
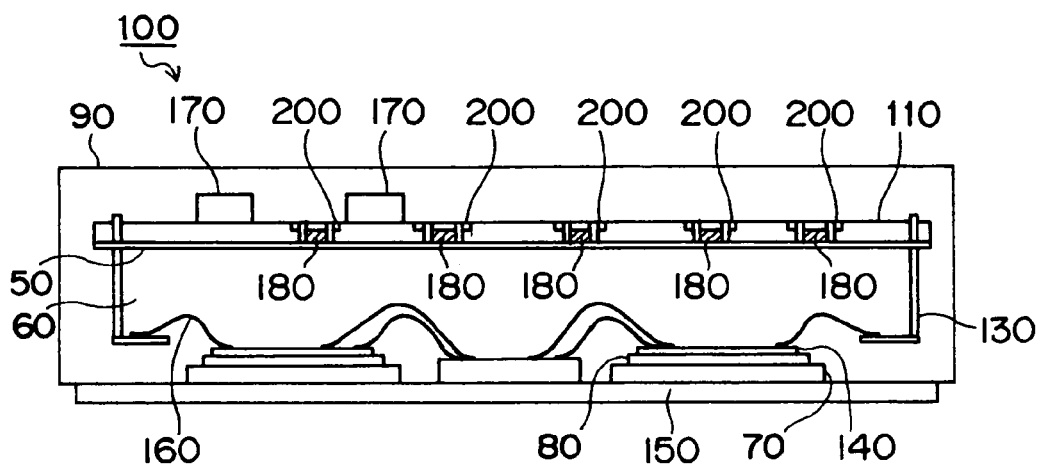
FIG. 5 is a schematic longitudinal sectional view of a power semiconductor device according to the fifth embodiment of the present invention.

FIG. 5 shows a schematic longitudinal sectional view of a power semiconductor device (100) according to the fifth embodiment of the present invention. The power semiconductor device (100) according to the fifth embodiment is substantially the same as that according to the third embodiment. Therefore, the like parts are denoted by the like reference numerals to thereby save the description thereof. Thus, the difference between both embodiments is mainly described.

In the power semiconductor device (100) according to the fifth embodiment, the through holes, filled with the insulating material (180), of the control circuit board (110) are connected to a ground. In addition, a ground solid pattern (50) is formed of an electrically conductive material on the surface of the control circuit board (110) opposing to the switching elements (140) (i.e., a surface of the control circuit board (110) closest to the switching elements (140)) (in other words, an electrode layer is provided on the reverse side of the control circuit board).

By providing the above ground solid pattern (the reverse electrode layer) (50), the resistance to noises is improved, and thus, it becomes harder to expose the electronic components, etc. to the influence of the noises.

Embodiment 6

Figure 6:
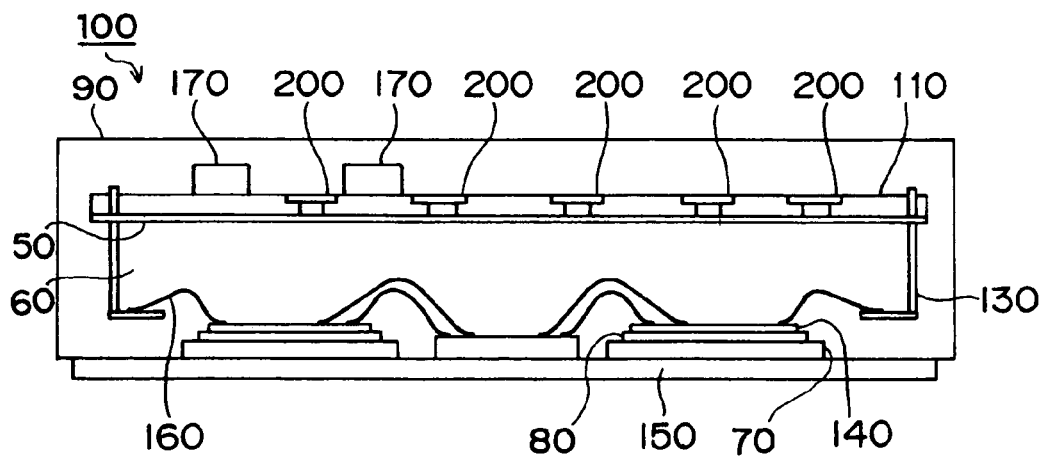
FIG. 6 is a schematic longitudinal sectional view of a power semiconductor device according to the sixth embodiment of the present invention.

FIG. 6 shows a schematic longitudinal sectional view of a power semiconductor device (100) according to the sixth embodiment of the present invention. The power semiconductor device (100) according to the sixth embodiment is substantially the same as that according to the fourth or fifth embodiment. Therefore, the like parts are denoted by the like reference numerals to thereby save the description thereof. Thus, the difference between both embodiments is mainly described.

In the power semiconductor device (100) according to the sixth embodiment, the through holes, filled with the electrically conductive material (190), of the control circuit board (110) are connected to a ground. In addition, a ground solid pattern (50) is formed of an electrically conductive material on the surface of the control circuit board (110) opposing to the switching elements (140) (i.e., a surface of the control circuit board (110) closest to the switching elements (140)) (in other words, an electrode layer is provided on the reverse side of the control circuit board), as in the fifth embodiment.

By providing the above ground solid pattern (the reverse electrode layer) (50), the resistance to noises is improved, and thus, it becomes harder to expose the electronic components, etc. to the influence of the noises.

What is claimed is:

1. A power semiconductor device comprising:
   at least one insulating substrate;
   at least one power semiconductor element mounted on a metal pattern formed on a main surface of the insulating substrate; and
   a control circuit board configured to have a first surface facing toward said main surface of the insulating substrate with the power semiconductor element interposed between the main surface and the first surface, wherein
   at least one electronic component for control is mounted on a metal pattern formed on a second surface of the control circuit board facing away from the main surface of the insulating substrate and extending in parallel to said first surface, and
   at least one through hole with a hollow region is provided vertically to said first and second surfaces and said through hole with the hollow region is configured to electrically connect circuit patterns laminated between the first surface and the second surface, said at least one through hole with the hollow region being filled with a filler not required to electrically connect said circuit patterns.

2. The power semiconductor device according to claim 1, wherein the filler is an electrically conductive material.

3. The power semiconductor device according to claim 2, wherein an electrically conductive solid pattern which is electrically connected to said at least one through hole connected to a ground is formed on the first surface of the control circuit board.

* * * * *